(12) United States Patent
Takano et al.

(10) Patent No.: US 9,412,767 B2
(45) Date of Patent: Aug. 9, 2016

(54) LIQUID CRYSTAL DISPLAY DEVICE AND METHOD OF MANUFACTURING A LIQUID CRYSTAL DISPLAY DEVICE

(71) Applicant: Panasonic Liquid Crystal Display Co., Ltd., Himeji-shi, Hyogo (JP)

(72) Inventors: Takao Takano, Hyogo (JP); Yukio Tahara, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 14/750,378

(22) Filed: Jun. 25, 2015

(65) Prior Publication Data

US 2015/0294989 A1 Oct. 15, 2015

Related U.S. Application Data

(62) Division of application No. 13/947,683, filed on Jul. 22, 2013, now abandoned.

(30) Foreign Application Priority Data

Jul. 23, 2012 (JP) ................................. 2012-162953

(51) Int. Cl.
*H01L 27/12* (2006.01)
*H01L 23/50* (2006.01)
*H01L 21/768* (2006.01)
*G02F 1/1343* (2006.01)
*G02F 1/1362* (2006.01)

(52) U.S. Cl.
CPC ........ *H01L 27/124* (2013.01); *G02F 1/134309* (2013.01); *G02F 1/134363* (2013.01); *G02F 1/136286* (2013.01); *H01L 21/768* (2013.01); *H01L 23/50* (2013.01); *H01L 27/1222* (2013.01); *G02F 2001/134372* (2013.01); *G02F 2201/40* (2013.01); *H01L 2924/0002* (2013.01)

(58) Field of Classification Search
CPC ... H01L 27/124; H01L 27/1222; H01L 23/50; H01L 23/482; H01L 21/768; H01L 2924/0002; H01L 27/3241; H01L 27/3244; H01L 23/52; G02F 1/14309; G02F 1/36386; G02F 2001/134372; G02F 2201/40; G02F 1/34363
USPC ......... 257/59, 72; 349/139–141, 143, 144, 39
See application file for complete search history.

(56) References Cited

U.S. PATENT DOCUMENTS 6,654,073 B1 * 11/2003 Maruyama et al. ............. 349/38
2002/0159016 A1   10/2002 Nishida et al.
(Continued)

FOREIGN PATENT DOCUMENTS

JP       2009-122299       6/2009

*Primary Examiner* — Galina Yushina
(74) *Attorney, Agent, or Firm* — Hamre, Schumann, Mueller & Larson, P.C.

(57) ABSTRACT

A liquid crystal display device (10) includes: gate wiring (501) formed on a substrate (500) and along a first direction; drain wiring (702) formed on the substrate (500) and along a second direction that is different from the first direction; a common electrode (900) formed so as to cover the drain wiring (702) through intermediation of an insulating film (800); and common wiring (901) formed on the common electrode (900) and along the drain wiring (702). The common wiring (901) is formed so that at least a part of the common wiring (901) overlaps with a region in which the drain wiring (702) is formed.

8 Claims, 13 Drawing Sheets

(56) References Cited

U.S. PATENT DOCUMENTS

| | | | |
|---|---|---|---|
| 2009/0109386 A1* | 4/2009 | Chen et al. | 349/123 |
| 2009/0121996 A1 | 5/2009 | Takano et al. | |
| 2009/0237342 A1* | 9/2009 | Maede et al. | 345/92 |
| 2010/0245733 A1* | 9/2010 | Ono | 349/106 |
| 2011/0175093 A1* | 7/2011 | Liou | H01L 27/1259 257/59 |
| 2012/0104392 A1* | 5/2012 | Son et al. | 257/59 |

\* cited by examiner

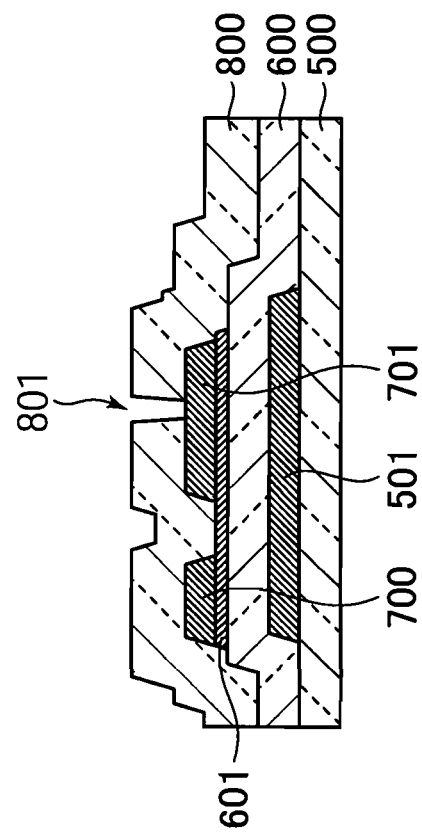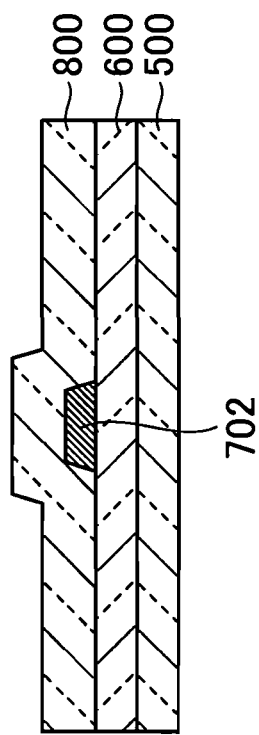

LIQUID CRYSTAL DISPLAY DEVICE AND METHOD OF MANUFACTURING A LIQUID CRYSTAL DISPLAY DEVICE

CROSS-REFERENCE TO RELATED APPLICATION

The present application claims priority from Japanese application JP 2012-162953 filed on Jul. 23, 2012, the content of which is hereby incorporated by reference into this application.

TECHNICAL FIELD

The present application relates to a liquid crystal display device and a method of manufacturing a liquid crystal display device.

BACKGROUND

A liquid crystal display device includes a thin film transistor substrate (TFT substrate) for displaying an image on a display surface by controlling transmission/non-transmission of light from a backlight unit through a liquid crystal material provided between the backlight unit and the display surface. The thin film transistor substrate includes a transparent substrate, a gate electrode arranged on the transparent substrate, a gate insulating film arranged on the gate electrode, a semiconductor layer arranged on the gate insulating film, a source electrode and a drain electrode arranged on the semiconductor layer, a protective insulating film arranged on the source electrode and the drain electrode, and a pixel electrode connected to the source electrode or the drain electrode. A part of the semiconductor layer, which is formed between the source electrode and the drain electrode, corresponds to a channel forming region in which a channel is to be formed.

FIG. 14 is a conceptual diagram of a pixel circuit 1401 formed of a thin film transistor 1402. The pixel circuit 1401 provided in the thin film transistor substrate controls transmission/non-transmission of light from the backlight unit provided so as to be opposed to the thin film transistor substrate.

One of a source and a drain of the thin film transistor 1402 is connected to a video signal line 1403, and the other of the source and the drain is connected to a pixel electrode 1404. In an in-plane switching (IPS) mode liquid crystal display device, the pixel electrode 1404 and a common electrode 1405 are formed in the thin film transistor substrate.

A video signal and a reference potential are applied to the video signal line 1403 and the common electrode 1405, respectively. Further, ON/OFF of the thin film transistor 1402 is controlled by a gate signal, to thereby change a potential difference between the pixel electrode 1404 and the common electrode 1405. A liquid crystal material 1406 sealed between the thin film transistor substrate and a color filter changes its orientation in accordance with the change of the potential difference (generated in a direction parallel to the surface of the thin film transistor substrate), and thus the transmission/non-transmission of light from the backlight unit is controlled.

Japanese Patent Application Laid-open No. 2009-122299 discloses a liquid crystal display device in which a counter voltage signal line for supplying a reference signal to a counter electrode is formed along a running direction of a gate signal line so as to overlap with the gate signal line, to thereby improve the aperture ratio.

SUMMARY

Hitherto, the liquid crystal display device has been used for applications that require a laterally-long display surface, such as a personal computer (PC) and a television set, but along with the popularization in recent years of an information processing device (tablet PC) and multifunctional cellular phone (smart phone) having a vertically-long planar shape, there is a growing demand for a liquid crystal display device having a vertically-long display surface. Further, there are cases where the thin film transistor, a base for a spacer, or the like is provided on the gate signal line. When the counter voltage signal line is formed along the running direction of the gate signal line so as to overlap with the gate signal line, it is necessary to wire the counter voltage signal line while avoiding the thin film transistor and the like, or wire the counter voltage signal line in a space obtained by expanding the gate signal line. In the former case, the wiring becomes complicated and a risk of disconnection increases, while in the latter case, the aperture ratio may reduce in some cases.

It is an object of the present implementation to provide a liquid crystal display device and a method of manufacturing a liquid crystal display device that are suitable for applications requiring a vertically-long display surface. Further, it is another object of the present implementation to provide a liquid crystal display device and a method of manufacturing a liquid crystal display device that are capable of preventing reduction in aperture ratio with a relatively-simple wiring design.

In order to solve the above-mentioned problem, a liquid crystal display device according to one embodiment of the present application includes: gate wiring formed on a substrate and along a first direction; drain wiring formed on the substrate and along a second direction that is different from the first direction; a common electrode formed so as to cover the drain wiring through intermediation of a first insulating film; and common wiring formed on the common electrode and along the drain wiring. The common wiring is formed so that at least a part of the common wiring overlaps with a region in which the drain wiring is formed.

According to the one embodiment of the present application, the liquid crystal display device is provided, in which the common wiring is formed along the drain wiring so that at least a part of the common wiring overlaps with the region in which the drain wiring is formed. When the liquid crystal display device is mounted on an information processing terminal or the like, generally, the drain wiring is formed in the vertical direction of the equipment. Further, potential fluctuations that occur due to the low conductivity of a tin-doped indium oxide (ITO) or the like, which is the material of the common electrode, notably occur particularly in the vertical direction in the vertically-long liquid crystal display device. In the present application, the common wiring for supplying a potential to the common electrode is formed along the drain wiring, that is, in the vertical direction. Therefore, the potential fluctuations are reduced, and as a result, more satisfactory display characteristics may be obtained. Therefore, the liquid crystal display device of the present application may be suitable used for applications requiring a vertically-long display surface. Further, the common wiring is formed in the vertical direction, and thus a driver circuit for the common wiring may be provided in a region above or below the thin film transistor substrate. Also in view of this point, the liquid crystal display device of the present application may be suitably used for applications requiring a vertically-long display surface. Further, at least a part of the common wiring overlaps with the region in which the drain wiring is formed. Therefore, a region in which light is blocked by each wiring is reduced, and hence reduction in aperture ratio can be prevented.

Further, in the one embodiment of the present application, the liquid crystal display device further includes: a second insulating film formed so as to cover the common electrode and the common wiring; and a pixel electrode formed on the second insulating film, at least a part of the pixel electrode overlapping with the common electrode.

Further, in the one embodiment of the present application, the common wiring has opposing pattern edges that are each separated from a pattern edge of the drain wiring at an interval of a predetermined width or more in plan view.

Further, in the one embodiment of the present application, the predetermined width is determined to be larger than an interval in plan view between the pattern edge of the drain wiring, and a boundary between, in a surface of the common electrode, a region that is inclined due to the drain wiring and a region parallel to a surface of the substrate.

Further, in the one embodiment of the present application, the predetermined width is 1 micrometer or more.

Further, in the one embodiment of the present application, one of opposing pattern edges of the common wiring is formed on a surface of the common electrode in a region parallel to a surface of the substrate and above the region in which the drain wiring is formed.

Further, in the one embodiment of the present application, both of opposing pattern edges of the common wiring is formed on a surface of the common electrode in a region parallel to a surface of the substrate and above the region in which the drain wiring is formed.

Further, in the one embodiment of the present application, both of opposing pattern edges of the common wiring is formed on a surface of the common electrode in a region parallel to a surface of the substrate and outside the region in which the drain wiring is formed.

Further, in the one embodiment of the present application, one of opposing pattern edges of the common wiring is formed in a region parallel to a surface of the substrate and above the region in which the drain wiring is formed, and another of the opposing pattern edges of the common wiring is formed in the region parallel to the surface of the substrate and outside the region in which the drain wiring is formed.

Further, a method of manufacturing a liquid crystal display device according to one embodiment of the present application includes: forming gate wiring on a substrate and along a first direction; forming drain wiring on the substrate and along a second direction that is different from the first direction; forming a common electrode so as to cover the drain wiring through intermediation of a first insulating film; and forming common wiring on the common electrode and along the drain wiring. The forming of the common wiring includes forming the common wiring so that at least apart of the common wiring overlaps with a region in which the drain wiring is formed.

BRIEF DESCRIPTION OF THE DRAWINGS

In the accompanying drawings.

FIGS. 8A and 8B are views illustrating the method of manufacturing a thin film transistor substrate according to the embodiment of the present application.

DETAILED DESCRIPTION

Figure 1:
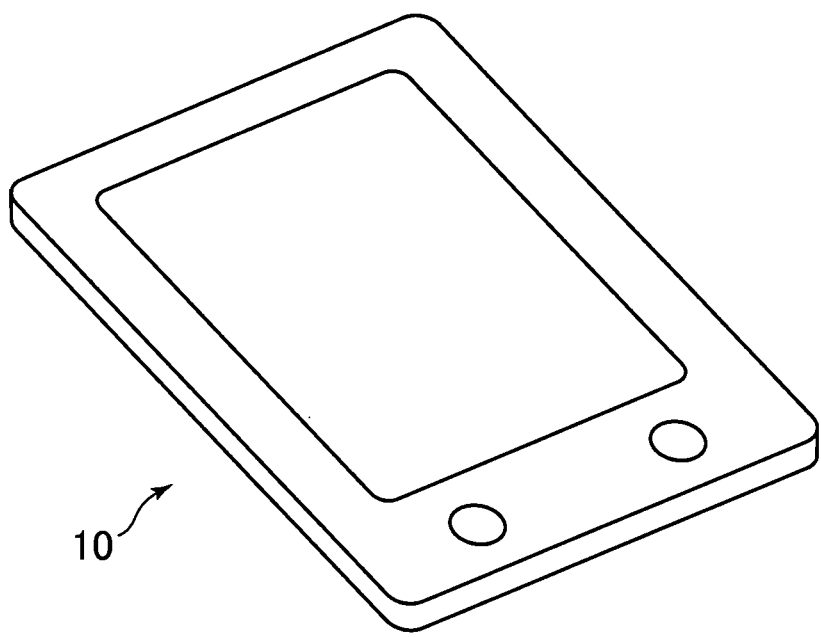
FIG. 1 is a view illustrating an example of a liquid crystal display device according to an embodiment of the present application.

FIG. 1 is a view illustrating an example of a liquid crystal display device 10 according to an embodiment of the present application. The liquid crystal display device 10 has a vertically-long display unit, and includes a thin film transistor substrate 100 provided inside, for controlling image display on the display unit.

Figure 2:
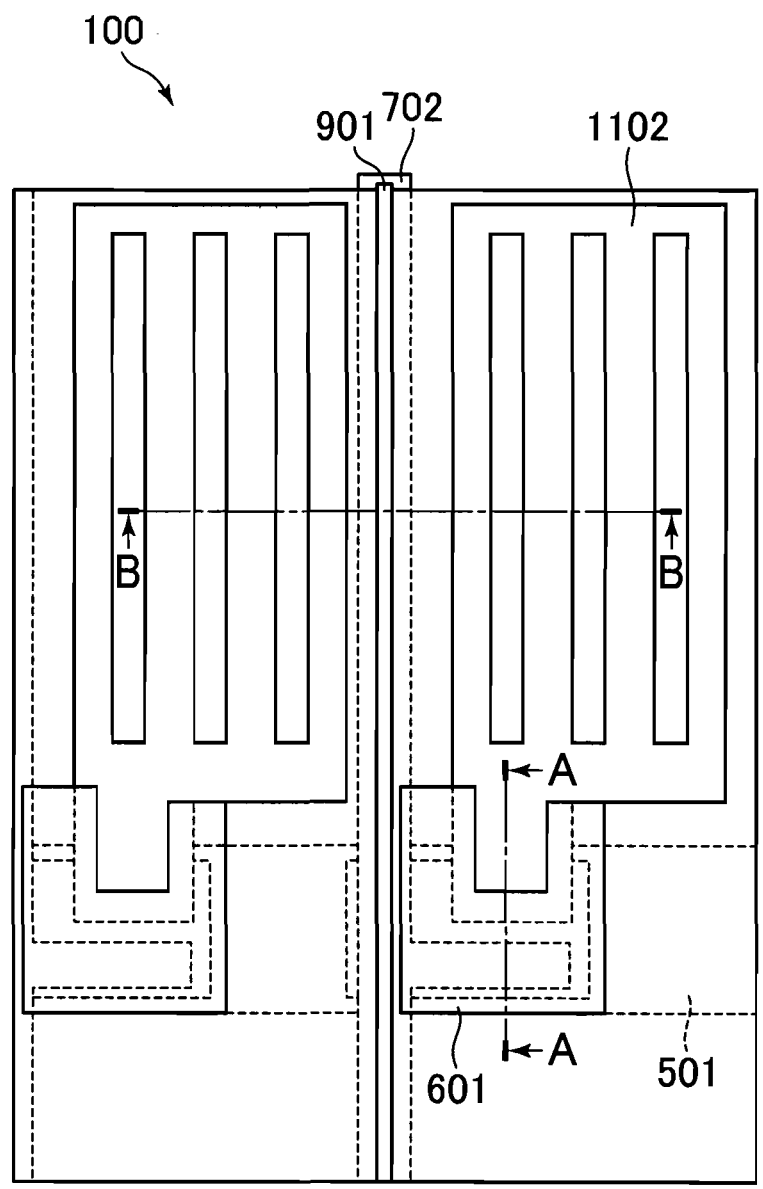
FIG. 2 is a view illustrating a configuration of a thin film transistor substrate provided in the liquid crystal display device according to the embodiment of the present application.
Figure 3:
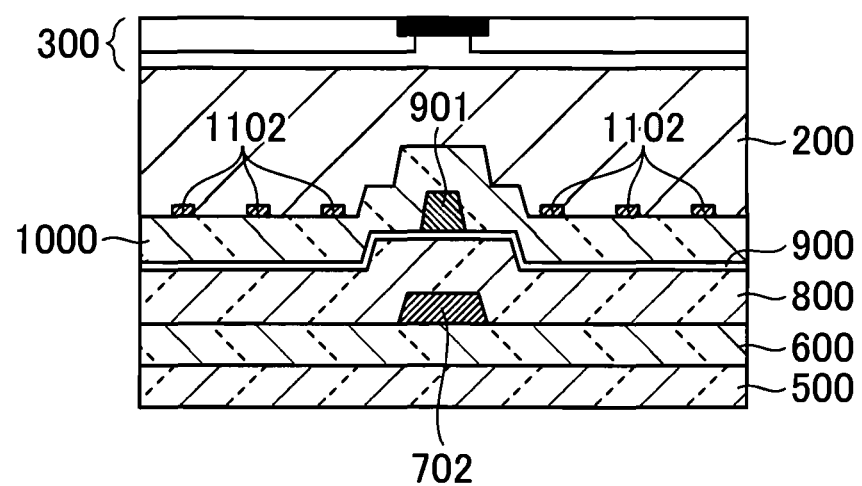
FIG. 3 is a view illustrating a structure of a cross-section taken along the line B-B in the thin film transistor substrate of FIG. 2.

FIG. 2 is a view illustrating a configuration of the thin film transistor substrate 100 provided in the liquid crystal display device 10 according to this embodiment. FIG. 3 is a view illustrating a structure of a cross-section taken along the line B-B in the thin film transistor substrate 100 of FIG. 2.

In the thin film transistor substrate 100, gate wiring 501 made of a metal such as Cu is formed on a substrate (transparent substrate) 500 made of non-alkali glass or the like and along a lateral direction (first direction) of FIG. 1. Further, on the substrate 500 and the gate wiring 501, an insulating film (gate insulating film) 600 made of a transparent insulating material such as SiN is formed. On the insulating film 600, drain wiring 702 made of a metal such as Cu is formed. The drain wiring 702 is formed along a vertical direction (second direction) of FIG. 1, which is different from the first direction. On the insulating film 600 and the drain wiring 702, an insulating film (passivation film, first insulating film) 800 made of a transparent insulating material such as SiN is formed.

A common electrode 900 formed of a transparent conductive film made of a tin-doped indium oxide (ITO) or the like is formed so as to cover the drain wiring 702 through intermediation of the insulating film 800. Common wiring 901 made of a metal such as Cu is formed on the common electrode 900 and along the drain wiring 702. In this case, the common wiring 901 is formed so as to overlap with a region in which the drain wiring 702 is formed. Further, on the common electrode 900 and the common wiring 901, an insulating film (passivation film) 1000 is formed. On the insulating film 1000, a pixel electrode 1102 formed of a transparent conductive film made of a tin-doped indium oxide (ITO) or the like is formed. A liquid crystal material 200 is sealed between a color filter 300 and the insulating film 1000 and pixel electrode 1102.

Figure 4A:
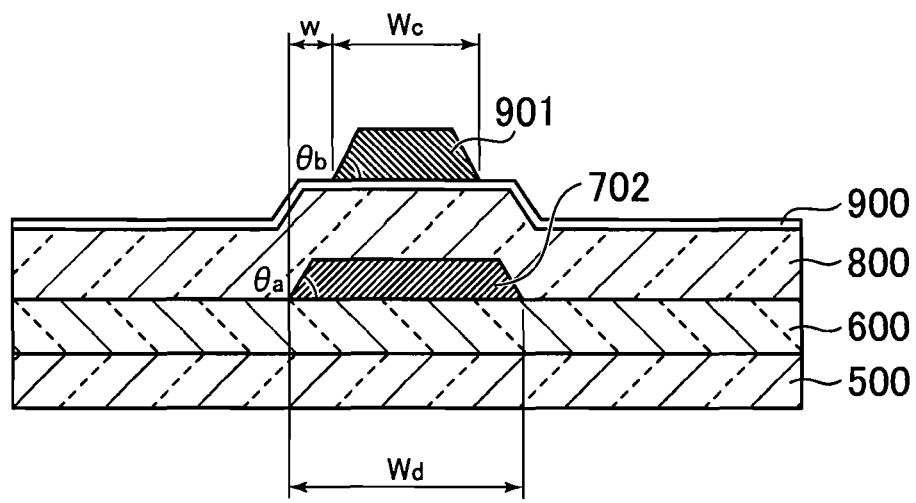
FIGS. 4A and 4B are views illustrating examples of a cross-section of the thin film transistor substrate.
Figure 4B:
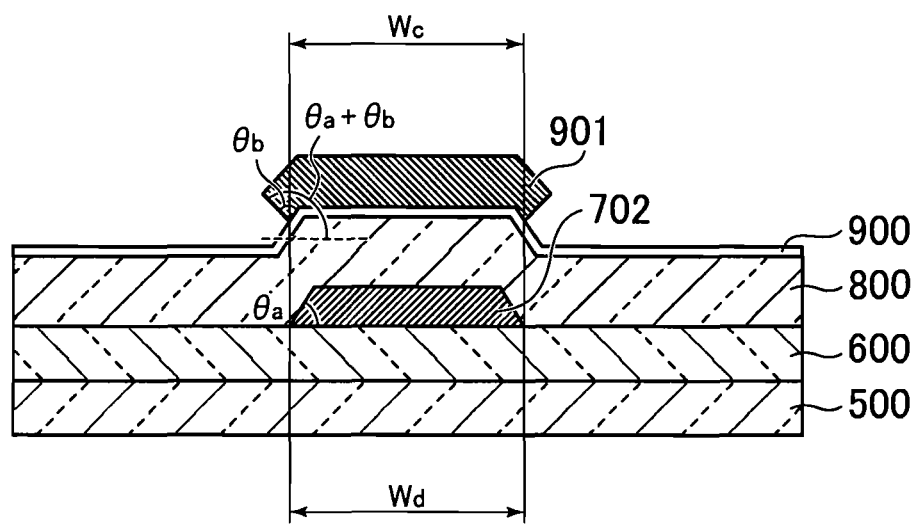

Now, a region in which the common wiring 901 is formed is described below. FIGS. 4A and 4B are views illustrating examples of a cross-section of the thin film transistor substrate. FIG. 4A illustrates a cross-section of the thin film transistor substrate 100 according to this embodiment, and FIG. 4B illustrates a cross-section of the thin film transistor substrate in another form. In a form illustrated in FIG. 4B, a width $W_c$ of the common wiring 901 and a width $W_d$ of the drain wiring 702 are substantially equal to each other, and a pattern edge of the common wiring 901 (a leading end part of the sectional shape of the common wiring 901, which has an angle of $\theta_b$) and a pattern edge of the drain wiring 702 (a leading end part of the sectional shape of the drain wiring 702, which has an angle of $\theta_a$) substantially overlap with each other in plan view (viewpoint from the upper side to the lower side in FIGS. 4A and 4B).

In each of the surfaces of the insulating film 800 and the common electrode 900, due to the step formed by the pattern edge of the drain wiring 702, an inclined surface is formed at an angle of $\theta_a$ that is equal to that of the pattern edge. In the thin film transistor substrate illustrated in FIG. 4B, the pattern edge of the common wiring 901 and the pattern edge of the drain wiring 702 substantially overlap with each other in plan view. Therefore, when the common wiring 901 is formed, due to the angle $\theta_b$ of the pattern edge of the common wiring 901, a taper angle of $\theta_a+\theta_b$ is formed with respect to the substrate surface (horizontal surface) in the vicinity of the pattern edge of the common wiring 901. When this angle has a relatively large value that exceeds 90°, for example, in rubbing processing of rubbing the surface of the thin film transistor substrate 100 in one direction with cloth to align the directions of liquid crystal molecules, which is carried out in the subsequent step, the cloth may not reach the (inner) surface that forms the taper angle. Thus, the rubbing processing may not be sufficiently carried out, and therefore satisfactory orientation may not be obtained.

In contrast, in the thin film transistor substrate 100 according to this embodiment illustrated in FIG. 4A, the width $W_c$ of the common wiring 901 is smaller than the width $W_d$ of the drain wiring 702, and the pattern edge of the common wiring 901 and the pattern edge of the drain wiring 702 do not overlapping with each other in plan view. As a result, when the common wiring 901 is formed, the taper angle formed with respect to the substrate surface (horizontal surface) in the vicinity of the pattern edge of the common wiring 901 is suppressed to $\theta_b$ formed by the pattern edge of the common wiring 901. With this, even in the rubbing processing, the cloth reaches the surface that forms the taper angle, and the rubbing processing is sufficiently carried out.

In this case, the width $W_c$ of the common wiring 901 is defined so that the pattern edge of the common wiring 901 is separated from the pattern edge of the drain wiring 702 at an interval of a predetermined width w or more in plan view. The predetermined width w is determined based on the sectional shape of the pattern edge of the drain wiring 702. For example, the predetermined width w is determined based on the dimensions of a region in the surface of the common electrode 900, which is inclined due to the pattern edge of the drain wiring 702. For example, the predetermined width w is determined to be larger than an interval in plan view between the pattern edge of the drain wiring 702, and a boundary between, in the surface of the common electrode 900, the region inclined due to the drain wiring 702 and a region parallel to the surface of the substrate 500. The predetermined width w is defined to be, for example, 1 micrometer or more.

With the configuration described above, the liquid crystal display device 10 including the thin film transistor substrate 100 is provided, in which the common wiring 901 is formed along the drain wiring 702 so that at least a part of the common wiring 901 overlaps with the region in which the drain wiring 702 is formed (in FIG. 2, a region defined by broken lines representing the drain wiring 702). In this case, the common wiring 901 is formed along the drain wiring 702 formed along the vertical direction of the liquid crystal display device 10 (vertical direction in FIG. 2), that is, the common wiring 901 is formed along the vertical direction. Therefore, in the thin film transistor substrate 100, potential fluctuations are reduced, which notably occur in the vertical direction due to the low conductivity of ITO that is the material of the common electrode 900. Thus, more satisfactory display characteristics can be obtained. Therefore, the thin film transistor substrate 100 may be suitably applied to the liquid crystal display device 10 having a vertically-long shape. Further, the common wiring 901 is formed in the vertical direction, and thus a driver circuit for the common wiring 901 can be provided in a region above or below the thin film transistor substrate 100. Also in view of this point, the thin film transistor substrate 100 may be suitably applied to the liquid crystal display device 10 having a vertically-long shape. Further, at least a part of the common wiring 901 overlaps with a region in which the drain wiring 702 is formed, and thus a region in which light is blocked by each wiring is reduced. Therefore, the reduction in aperture ratio can be prevented as well.

Next, a method of manufacturing the thin film transistor substrate 100 of the liquid crystal display device 10 according to this embodiment is described. FIG. 5A to FIG. 11B are views illustrating the method of manufacturing the thin film transistor substrate 100 according to this embodiment. In FIG. 5A to FIG. 11B, FIGS. 5A, 6A, 7A, 8A, 9A, 10A, and 11A illustrate a structure of a cross-section taken along the line A-A of FIG. 2, and FIGS. 5B, 6B, 7B, 8B, 9B, 10B, and 11B illustrate a structure of a cross-section taken along the line B-B of FIG. 2.

Figure 5B:
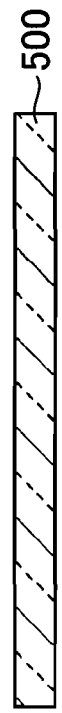
FIGS. 5A and 5B are views illustrating a method of manufacturing a thin film transistor substrate according to the embodiment of the present application.
Figure 5A:
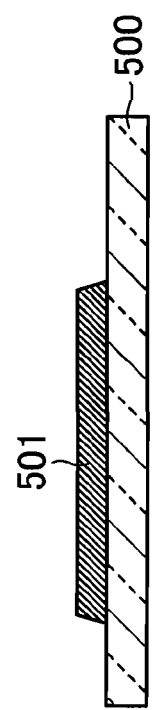

First, as illustrated in FIGS. 5A and 5B, on the substrate 500, the gate wiring 501 is formed along the lateral direction (first direction) of FIG. 1. The gate wiring 501 is formed as follows. A Cu film is formed on the substrate 500 by sputtering, and then unnecessary parts of the Cu film are removed by a photolithography process (application of a photoresist, selective exposure with use of a photomask, and development) and etching.

Figure 6A:
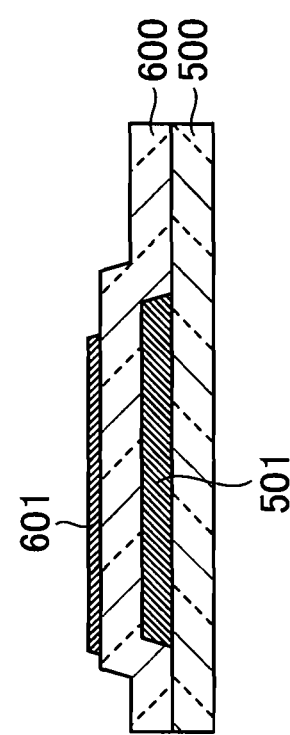
FIGS. 6A and 6B are views illustrating the method of manufacturing a thin film transistor substrate according to the embodiment of the present application.
Figure 6B:

Next, as illustrated in FIGS. 6A and 6B, on the substrate 500, the insulating film 600 is formed by, for example, CVD so as to cover the gate wiring 501. Further, on the insulating film 600, a semiconductor layer 601 made of amorphous silicon (aSi) is formed. The semiconductor layer 601 is processed into a predetermined shape by a photolithography process and etching.

Figure 7B:
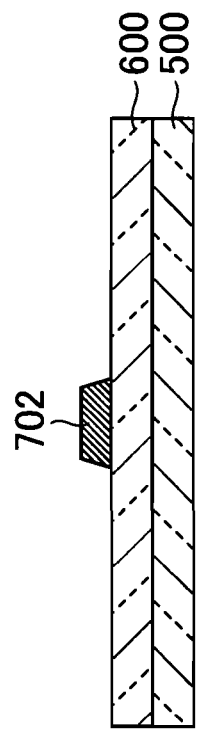
FIGS. 7A and 7B are views illustrating the method of manufacturing a thin film transistor substrate according to the embodiment of the present application.
Figure 7A:
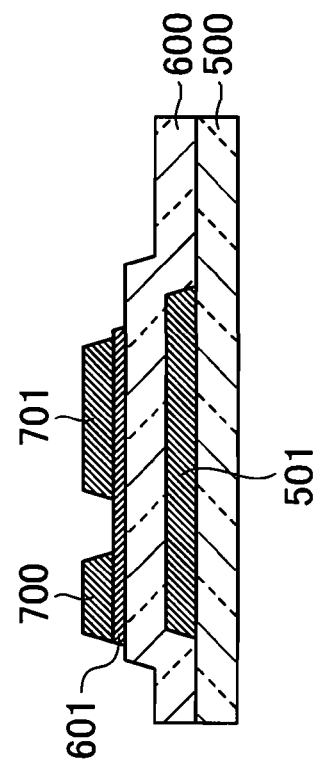

Next, as illustrated in FIGS. 7A and 7B, a drain electrode 700 and a source electrode 701 are formed on the semiconductor layer 601 and the drain wiring 702 is formed on the insulating film 600 by a photolithography process and etching. In this case, the drain wiring 702 is formed along the vertical direction (second direction) of FIG. 1, which is different from the first direction.

Figure 9B:
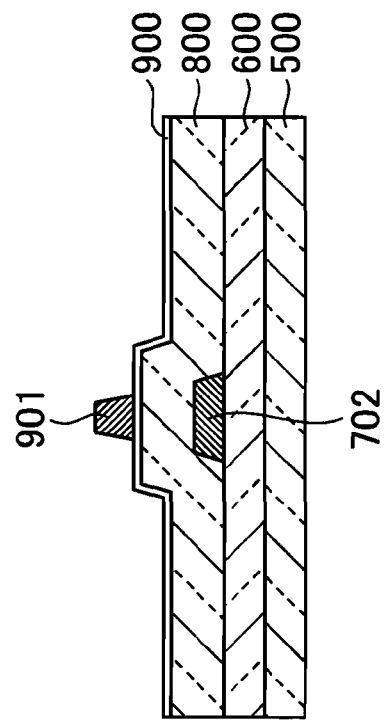
FIGS. 9A and 9B are views illustrating the method of manufacturing a thin film transistor substrate according to the embodiment of the present application.
Figure 9A:
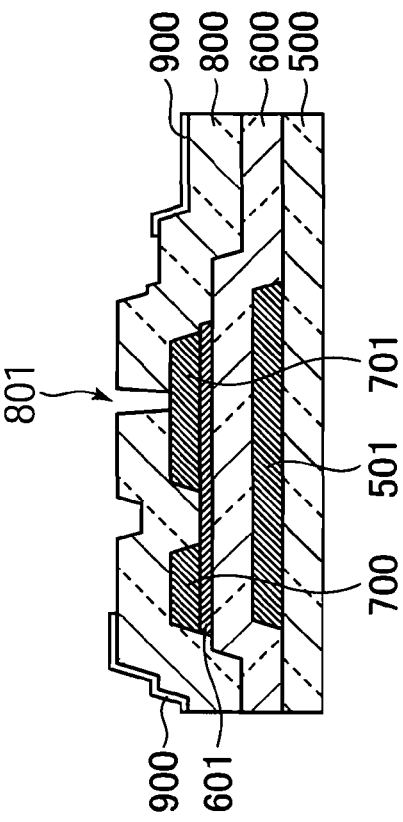

Next, as illustrated in FIGS. 8A and 8B, the insulating film 800 is formed by, for example, CVD. Further, the insulating film 800 is processed by photolithography to form a contact hole 801. Then, as illustrated in FIGS. 9A and 9B, the common electrode 900 is formed by sputtering, and further, the common wiring 901 is formed by a photolithography process and etching. In this case, the common electrode 900 is formed so as to cover the drain wiring 702 through intermediation of the insulating film 800, and the common wiring 901 is formed along the drain wiring 702. Further, at least a part of the common wiring 901 is formed so as to overlap with the region in which the drain wiring 702 is formed.

Figure 10A:
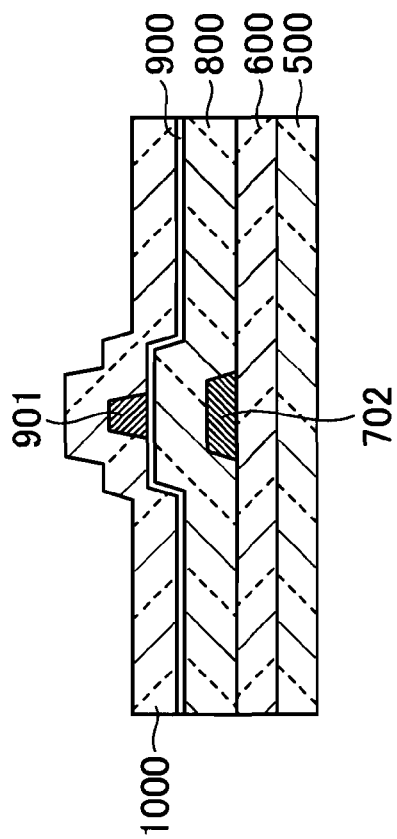
FIGS. 10A and 10B are views illustrating the method of manufacturing a thin film transistor substrate according to the embodiment of the present application.
Figure 10B:
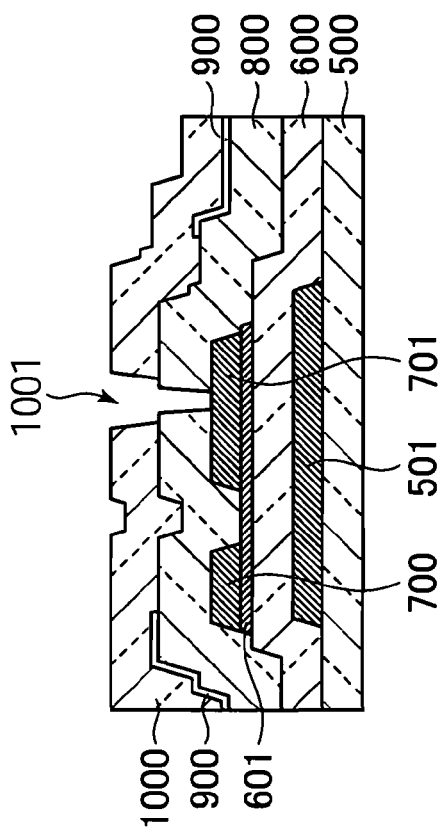

Further, as illustrated in FIGS. 10A and 10B, the insulating film 1000 is formed by, for example, CVD, and the insulating film 1000 is processed by a photolithography process and etching to form a contact hole 1001.

Figure 11B:
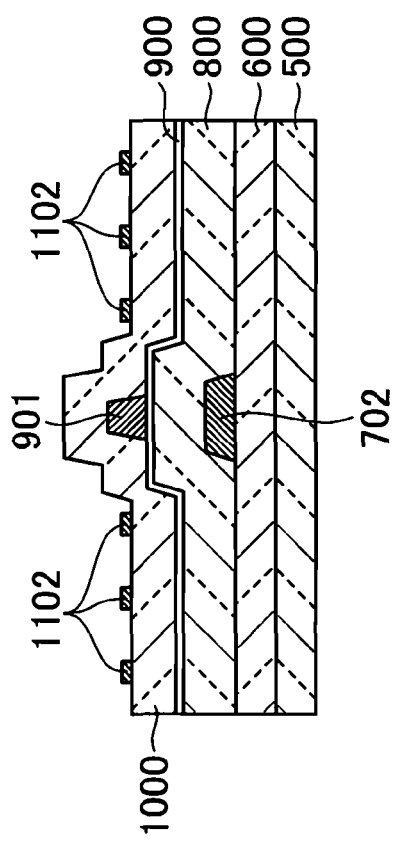
FIGS. 11A and 11B are views illustrating the method of manufacturing a thin film transistor substrate according to the embodiment of the present application.
Figure 11A:
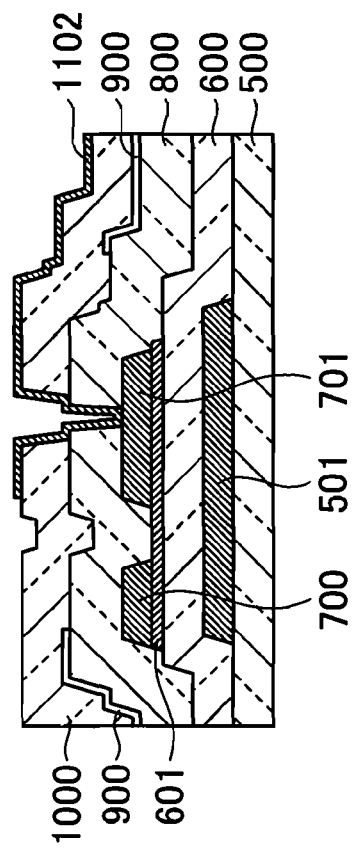

Next, a metal film is formed on the insulating film 1000, and the metal film is processed by a photolithography process and etching, to thereby form the pixel electrode 1102 as illustrated in FIGS. 11A and 11B.

With the above-mentioned steps, the thin film transistor substrate 100 according to this embodiment is manufactured.

Note that, in the above-mentioned embodiment, description is made of a configuration in which the width $W_c$ of the common wiring 901 is smaller than the width $W_d$ of the drain wiring 702, and both of the opposing pattern edges of the common wiring 901 are formed on the surface of the common electrode 900 in a region parallel to the surface of the substrate 500 and above the region in which the drain wiring 702 is formed. However, the present application is not limited thereto, and other configurations may be adopted as long as the configuration does not cause increase in taper angle in the pattern edge of the common wiring 901 due to the pattern edge of the drain wiring 702.

Figure 12:
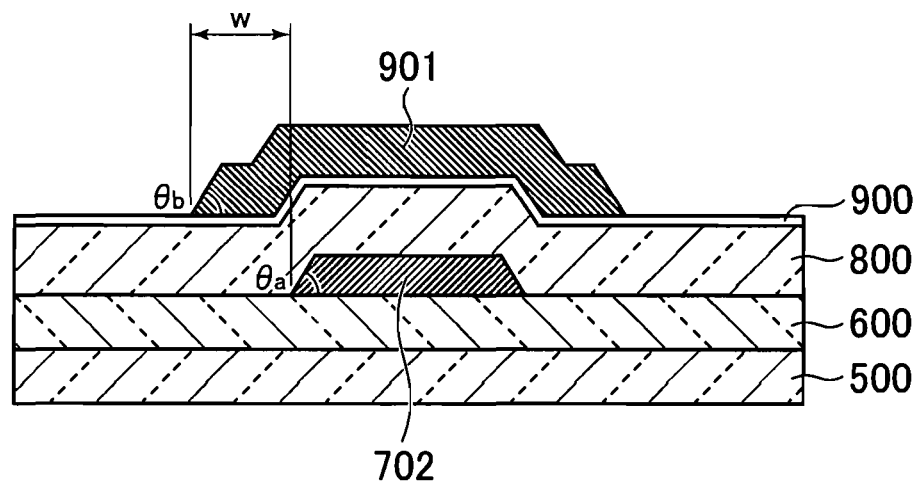
FIG. 12 is a view illustrating a configuration of a thin film transistor substrate according to another embodiment of the present application.
Figure 13:
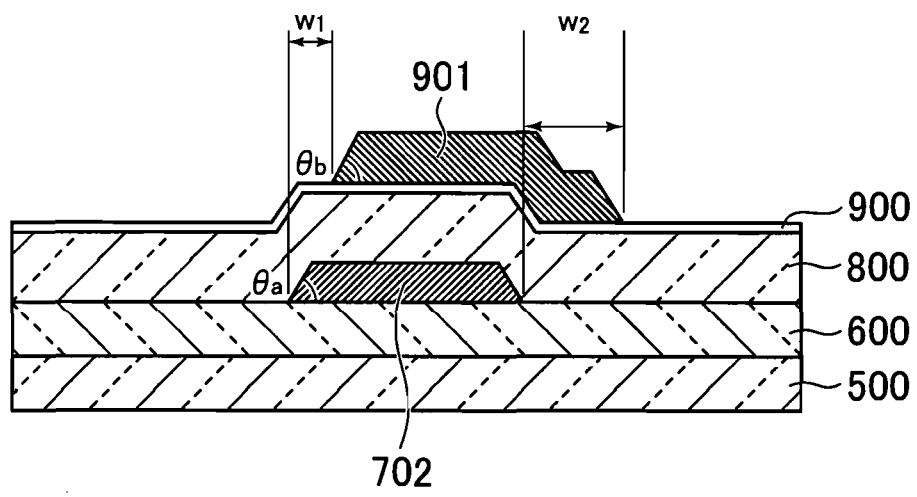
FIG. 13 is a view illustrating a configuration of a thin film transistor substrate according to further another embodiment of the present application.
Figure 14:
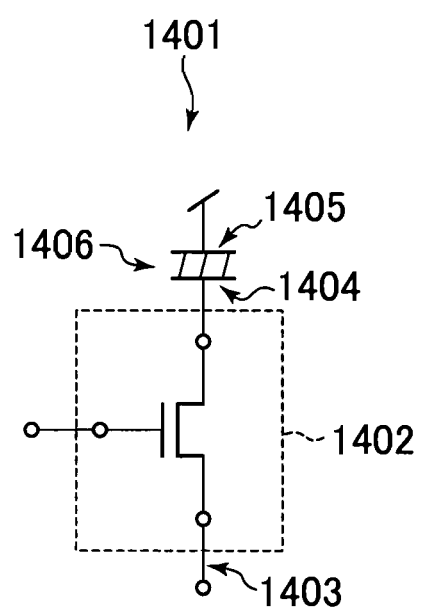
FIG. 14 is a conceptual diagram of a pixel circuit formed of a thin film transistor.

FIGS. 12 and 13 are views illustrating configurations of the thin film transistor substrate 100 according to other embodiments of the present application. In FIG. 12, both of the opposing pattern edges of the common wiring 901 are formed on the surface of the common electrode 900 in regions parallel to the surface of the substrate 500 and outside the region in which the drain wiring 702 is formed. In FIG. 13, one of the opposing pattern edges of the common wiring 901 is formed in a region parallel to the surface of the substrate 500 and above the region in which the drain wiring 702 is formed. Also in those configurations, the pattern edge of the common wiring 901 and the pattern edge of the drain wiring 702 are separated from each other at an interval of a predetermined width or more, similarly to the above-mentioned embodiment. Further, in the case where the pattern edge of the common wiring 901 is formed outside the region in which the drain wiring 702 is formed, even when the pattern edge of the common wiring 901 is separated at the interval of a predetermined width or more of the above-mentioned embodiment, when the inclined surface (side surface) of the common wiring 901 overlaps with the inclined surface in the surface of the common electrode 900, the inclined surface of the common wiring 901 may become steep. Therefore, in such a case, the common wiring 901 may be formed so as to be separated from the pattern edge of the drain wiring 702 at a larger interval to the extent that the inclined surface of the common wiring 901 does not overlap with the inclined surface in the surface of the common electrode 900. Also with those configurations, effects similar to those in the above-mentioned embodiment are obtained.

In the above, the specific embodiments of the present application have been described, but the present application is not limited to the above-mentioned embodiments, and various modifications may be made as appropriate without departing from the spirit of the present application.

What is claimed is:

1. A liquid crystal display device, comprising:
   a gate wiring formed on a substrate and along a first direction;
   a drain wiring formed on the substrate and along a second direction that is different from the first direction;
   a common electrode formed so as to cover the drain wiring through intermediation of a first insulating film; and
   a common wiring electrically connected with the common electrode, at least a part of the common wiring overlapping with the drain wiring, when viewed from above an upper surface of the common wiring,
   wherein one of opposing pattern edges of the common wiring is formed above a region in which the drain wiring is formed, when viewed from above an upper surface of the common wiring, and
   another of the opposing pattern edges of the common wiring is formed above a region located outside the region in which the drain wiring is formed, when viewed from above the upper surface of the common wiring,
   wherein each of the first insulating film and the common electrode has a raised portion formed above the drain wiring, when viewed from above the upper surface of the common wiring,
   wherein at least a part of the common wiring overlaps with the raised portion of the common electrode, when viewed from above the upper surface of the common wiring, and
   wherein the one of the opposing pattern edges of the common wiring overlaps with the raised portion of the common electrode when viewed from above the upper surface of the common wiring, and the other of the opposing pattern edges of the common wiring is formed above a region located outside the region in which the raised portion of the common electrode is formed when viewed from above an upper surface of the common wiring.

2. The liquid crystal display device of claim 1, wherein both of the opposing pattern edges of the common wiring have an angle of less than 90 degrees with respect to a bottom surface of the common wiring.

3. The liquid crystal display device of claim 1, wherein the common wiring has a portion which is wider than the drain wiring in a cross sectional view along the first direction.

4. The liquid crystal display device of claim 1 further comprising a pixel electrode, wherein the pixel electrode is positioned over the common electrode.

5. The liquid crystal display device of claim 1, wherein the common wiring has a line which overlaps with the drain wiring, when viewed from above the upper surface of the common wiring, the line of the common wiring is extended along the second direction.

6. The liquid crystal display device of claim 1, wherein the common wiring is positioned higher than the gate wiring.

7. The liquid crystal display device of claim 1, wherein the common wiring is positioned higher than the drain wiring.

8. The liquid crystal display device of claim 1, wherein the one of the opposing pattern edges of the common wiring overlaps with a portion of the drain wiring that is between two opposing drain wiring pattern edges, when viewed from above an upper surface of the common wiring.

\* \* \* \* \*